(12) United States Patent
Chakrabarti et al.

(10) Patent No.: US 10,483,464 B1
(45) Date of Patent: Nov. 19, 2019

(54) RESISTIVE SWITCHING MEMORY DEVICE

(71) Applicants: UCHICAGO ARGONNE, LLC, Chicago, IL (US); THE UNIVERSITY OF CHICAGO, Chicago, IL (US)

(72) Inventors: Bhaswar Chakrabarti, Westmont, IL (US); Leonidas E. Ocola, Oswego, IL (US); Supratik Guha, Lemont, IL (US); Sushant Sonde, Lemont, IL (US)

(73) Assignees: UCHICAGO ARGONNE, LLC, Chicago, IL (US); THE UNIVERSITY OF CHICAGO, Chicago, CA (US)

( * ) Notice: Subject to any disclaimer, the term of this patent is extended or adjusted under 35 U.S.C. 154(b) by 0 days.

(21) Appl. No.: 15/994,589

(22) Filed: May 31, 2018

(51) Int. Cl.
*H01L 45/00* (2006.01)
(52) U.S. Cl.
CPC ........ *H01L 45/146* (2013.01); *H01L 45/1253* (2013.01); *H01L 45/1608* (2013.01)
(58) Field of Classification Search
None
See application file for complete search history.

(56) References Cited

U.S. PATENT DOCUMENTS

| | | | |
|---|---|---|---|
| 6,057,035 A | 5/2000 | Singh et al. | |
| 7,294,875 B2 | 11/2007 | Kozicki | |
| 7,453,081 B2 | 11/2008 | Happ et al. | |
| 8,241,417 B2 | 8/2012 | Huang | |
| 9,117,818 B2 | 8/2015 | Miller | |
| 9,146,463 B2 | 9/2015 | Rao et al. | |
| 9,716,223 B1* | 7/2017 | Chen | H01L 45/1233 |
| 9,786,511 B2 | 10/2017 | Darling et al. | |
| 2004/0256662 A1 | 12/2004 | Black et al. | |
| 2010/0027320 A1* | 2/2010 | Muraoka | G11C 13/00 365/148 |
| 2012/0046421 A1* | 2/2012 | Darling | C08F 8/42 525/371 |
| 2012/0241706 A1* | 9/2012 | Lee | H01B 1/22 257/2 |
| 2013/0251965 A1 | 9/2013 | Rao et al. | |
| 2015/0064442 A1 | 3/2015 | Kim et al. | |
| 2016/0104840 A1 | 4/2016 | Cook et al. | |
| 2016/0163767 A1* | 6/2016 | Kim | G11C 13/0014 257/43 |

OTHER PUBLICATIONS

Sun, Yanmei, et al. "Nonvolatile Ternary Resistive Switching Memory Devices Based on the Polymer Composites Containing Zinc Oxide Nanoparticles." Physical Chemistry Chemical Physics, vol. 20, No. 8, 2018, pp. 5771-5779., doi:10.1039/c7cp07887k. (Year: 2018).*
Chen et al., An Ultrathin Forming-Free HfOx Resistance Memory With Excellent Electrical Performance, IEEE Electron Device Letters, 31(12):1473-5 (Nov. 2010).
Ji et al., Flexible Nanoporous WO3-x Nonvolatile Memory Device, ACS Nano., 10(8):7598-603 (2016).
Waldrop, The chips are down for Moore's law, Nature, 530(7589):144-7 (2016).
Wang et al., Nanoporous silicon oxide memory, Nano Lett., 14(8):4694-9 (2014).

\* cited by examiner

*Primary Examiner* — J. E. Schoenholtz
(74) *Attorney, Agent, or Firm* — Marshall, Gerstein & Borun LLP (57) ABSTRACT

Provided herein are resistive switching devices comprising a nanocomposite, an inert electrode and an active electrode. Also provided are methods for preparing and using the disclosed resistive switching devices.

21 Claims, 6 Drawing Sheets

RESISTIVE SWITCHING MEMORY DEVICE

STATEMENT OF US GOVERNMENT SUPPORT

The United States Government has rights in this invention pursuant to Contract No. DE-AC02-06CH11357 between the United States Government and UChicago Argonne, LLC representing Argonne National Laboratory.

BACKGROUND

Recent scaling trends in semiconductor technologies including both logic and memory indicate that the current technologies will soon reach their performance limits. As a result, not only alternative technologies are being actively sought but entirely new computational frameworks are being investigated. Resistance switching devices have been investigated recently not only as a replacement for current state-of-the art flash memory technology but also for neuromorphic computation. The emerging field of neuromorphic computation which is expected to be orders of magnitude more efficient at analyzing increasingly complex exa-scale data compared to conventional Von-Neumann computation. Large volumes of data are needed to be analyzed in many different private and public sectors including social media, search engines, public health, national security and many more. Resistive switching memories are ideal candidates for creating such neuromorphic hardware due to their scalability and ease of 3D integration for achieving extremely high device density. However, resistive switching memories developed so far suffer from a variety of issues including high operating voltage and current values as well as large device-to-device and cycle-to-cycle variability. There is a need for low operating voltage and current as well as limited variability for resistive switching memory technology.

SUMMARY

Provided herein are resistive switching devices comprising nanocomposites comprising a polymer with a metal oxide infiltrated throughout the polymer, an inert electrode, and an active electrode, wherein the inert electrode and the active electrode are separated by the nanocomposite.

In embodiments, the polymer comprises poly(methyl methacrylate), polydimethyl siloxane, polyimide, bisphenol A novolac epoxy, or a mixture thereof. In some cases, the polymer comprises poly(methyl methacrylate).

In various embodiments, the metal oxide comprises aluminum oxide ($Al_2O_3$), titanium oxide ($TiO_2$), hafnium oxide ($HfO_2$), zinc oxide (ZnO), or a mixture thereof. In some cases, the metal oxide comprises $Al_2O_3$.

In various cases, the nanocomposite has a thickness of 10 nm to 50 nm. In some cases, the nanocomposite has a thickness of 10 nm. In various embodiments, the nanocomposite comprises a porous section. In some embodiments, the porous section of the nanocomposite comprises pore sizes of about 1 nm.

In various cases, the inert electrode comprises platinum, palladium, titanium, gold, or a mixture thereof. In some cases, the inert electrode comprises platinum, titanium, or a combination of. In embodiments, the inert electrode has a thickness of 30 to 70 nm.

In various embodiments, the active electrode comprises gold or platinum and either silver or copper. In some embodiments, the active electrode comprises a film of silver or copper with a gold layer on top. In some cases, the film of silver or copper has a thickness of 5 to 20 nm and the gold layer has a thickness of 50 nm to 100 nm. In some embodiments, the active electrode has an area of 1,000 $\mu m^2$ to 20,000 $\mu m^2$.

In various embodiments, the resistive switching device disclosed herein, can further comprise a silicon substrate under the inert electrode, optionally where the silicon substrate comprises a p-type dopant with resistivity of 1 to 10 $\Omega$/cm. In some embodiments, the resistive switching device described herein can have a switching current of 500 nA to 100 $\mu$A, or an operating voltage of about 400 mV.

Another aspect of the disclosure provides a method of preparing the resistive switching device as described herein comprising (a) depositing the polymer on the first electrode by spin-coating to form a polymer layer, baking the polymer layer at a temperature of 180° C., and optionally irradiating a portion of the polymer layer with an electron beam to form a higher porosity polymer, (b) infiltrating the polymer layer with a metal oxide using sequential infiltration synthesis via atomic layer deposition to form the nanocomposite, and (c) depositing the second electrode on the nanocomposite by photolithography followed by electron beam evaporation of the second electrode metal or metals.

In some embodiments, the second electrode is prepared by electron beam evaporation of silver or copper to a thickness of 10 nm then electron beam evaporation of gold to a thickness of 70 nm.

DETAILED DESCRIPTION

Provided herein are resistive switching devices which can be used, e.g., as solid-state memories or neuromorphic circuits. The disclosure herein relates to resistive switching devices comprising (i) a nanocomposite comprising a polymer with a metal oxide infiltrated throughout the polymer, (ii) an inert electrode and (iii) an active electrode, wherein the inert electrode and active electrode are separated by the nanocomposite.

The resistive switching device disclosed herein can have several advantages, for example, low power consumption and reduced variability from device to device. In some cases, the device can operate at ultra-low voltages (e.g., about 400 mV), achieve ultra-low current operation (e.g., about 500 nA), and/or demonstrate high device-to-device and cycle-to-cycle uniformity.

A resistive switching device disclosed herein is a device having two resistance states, a high resistance state (HRS) and a low resistance state (LRS), that can be achieved by an appropriate electric stimulus such as a certain voltage that "switches" the device from one state to the other. The HRS is a state where the resistive switching device is non-conducting, and can be achieved upon application of a voltage of greater than or equal to $|V_{OFF}|$ about 400 mV. The LRS is a state where the resistive switching device is conducting, and can be achieved upon application of a voltage of greater than or equal to $|V_{ON}|$ about 400 mV.

The resistive switching devices presented herein can further comprise a substrate layer under the inert electrode. The substrate layer can comprise any suitable resistive substrate. In embodiments, the substrate layer can be doped with p-type or n-type semiconductors. In embodiments, the substrate layer comprises silicon. In embodiments, the silicon can be doped with p-type or n-type semiconductors. In embodiments, the substrate comprises a p-type dopant. In embodiments, the substrate comprises silicon and a p-type dopant. In embodiments, the substrate comprises a dopant with resistivity of 1 to 100 Ω/cm. In embodiments, the substrate comprises a dopant with resistivity of 1 to 50 Ω/cm. In embodiments, the substrate comprises a dopant with resistivity of 1 to 10 Ω/cm, such as 1 Ω/cm, 2 Ω/cm, 3 Ω/cm, 4 Ω/cm, 5 Ω/cm, 6 Ω/cm, 7 Ω/cm, 8 Ω/cm, 9 Ω/cm or 10 Ω/cm.

The resistive switching devices disclosed herein can operate at ultra-low voltages and can switch at ultra-low currents without sacrificing the low-voltage operability. In embodiments, the resistive switching devices herein can operate at voltages of about 200 mV to about 10 V. In embodiments, the resistive switching devices herein can operate at voltages of about 200 mV to about 700 mV, such as about 200 mV, about 300 mV, about 400 mV, about 500 mV, about 600 mV, and about 700 mV. In embodiments, the resistive switching devices herein can operate at voltages of about 400 mV. In embodiments, the resistive switching devices herein can switch at currents of 100 nA to 1 mA. In embodiments, the resistive switching devices herein can switch at currents of 100 nA to 100 μA. In embodiments, the resistive switching devices herein can switch at currents of 500 nA to 100 μA. In embodiments, the resistive switching devices herein can switch at currents of 500 nA or greater. In embodiments, the resistive switching devices herein can switch at currents of about 500 nA without sacrificing the low-voltage operability.

The use of the terms "a," "an," "the," and similar referents in the context of describing the invention (especially in the context of the claims) are to be construed to cover both the singular and the plural, unless otherwise indicated. Recitation of ranges of values herein merely are intended to serve as a shorthand method of referring individually to each separate value falling within the range, unless otherwise indicated herein, and each separate value is incorporated into the specification as if it were individually recited herein. The use of any and all examples, or exemplary language (e.g., "such as") provided herein, is intended to better illustrate the invention and is not a limitation on the scope of the invention unless otherwise indicated. No language in the specification should be construed as indicating any non-claimed element as essential to the practice of the invention.

As used herein, the terms "about" and "approximately" generally mean plus or minus 10% of the stated value. For example, about 0.5 would include 0.45 and 0.55, about 10 would include 9 to 11, about 1000 would include 900 to 1100.

Nanocomposite

The nanocomposites used herein are composites comprising a polymer with metal oxide nanoparticles infiltrated throughout the polymer. The nanocomposites present herein can be prepared by any suitable method to one skilled in the art wherein the metal oxide is dispersed throughout the polymer. In embodiments, the nanocomposite can be prepared by any chemical vapour deposition method, for example atomic layer deposition. In embodiments, the nanocomposite can be prepared by an atomic layer deposition method, such as sequential infiltration synthesis ("SIS"). In embodiments, the nanocomposite can be prepared by sequential infiltration synthesis. In embodiments, the metal oxide nanoparticles are "infiltrated" throughout the polymer via a method called sequential infiltration synthesis ("SIS"), wherein the polymer is exposed to various gas phase precursors to synthesize the metal oxides in situ. This synthetic method allows for the metal oxide to coat the surfaces of the polymer and infiltrate into the bulk polymer. The term "infiltrate" herein refers to the coating and/or filling of the free volume available in the polymer matrix of the polymer in a uniform manner such as to form a thin film covering the inner and outer walls of the space between polymer chains of the polymer. The SIS process uses a pair of gaseous precursors to form the infiltrated metal oxide disclosed herein. A first precursor comprises a desired metal or metal-containing compound suitable for SIS, such as trimethyl aluminum, titanium tetrachloride, or diethyl zinc, selected to infiltrate the polymer. A second precursor comprises a compound suitable for SIS selected to react with the first precursor or a portion thereof, such as an oxygen source (e.g., H$_2$O, O$_2$, O$_3$, H$_2$O$_2$) or a reducing agent (e.g., H$_2$, H$_2$S$_2$Si$_2$H$_6$). For example, a metal oxide can be synthesized via reaction of a first precursor and a second precursor while infiltrated in the polymer using SIS, thereby resulting in the metal oxide infiltrated throughout the polymer.

In embodiments where the nanocomposite is prepared via SIS, the polymer of the nanocomposite is exposed to gas phase precursors of the metal oxides, in situ. Using SIS allows for the metal oxides to coat the surfaces of the polymer including infiltrating the polymer. Examples of contemplated metal oxides include $Al_2O_3$, $TiO_2$, ZnO, $SiO_2$, $HfO_2$, $ZrO_2$, and oxides of cerium, lanthanum, yttrium, erbium, terbium, ytterbium, scandium, praseodymium, gadolinium, and samarium. In some cases, the metal oxide is $Al_2O_3$, $TiO_2$, ZnO, $SiO_2$, $HfO_2$, or $ZrO_2$. In embodiments, the gas phase precursors used during SIS comprise water. In embodiments, the gas phase precursors used during SIS comprise water and one or more aluminum containing precursors, such as trimethyl aluminum. The SIS can be performed at temperatures of 80° C. to 150° C., such as 80° C., 85° C., 90° C., 95° C., 100° C., 105° C., 110° C., 115° C., 120° C., 125° C., 130° C., 135° C., 140° C., 145° C., and 150° C. In embodiments, SIS can be performed at a temperature of 95° C. The SIS can be performed in any number of cycles suitable to one of ordinary skill in the art. In embodiments, the SIS can be performed in 15 to 35 cycles or 20 to 30 cycles. Specific cycles contemplated include 15, 16, 17, 18, 19, 20, 21, 22, 23, 24, 25, 26, 27, 28, 29, 30, 31, 32, 33, 34, and 35 cycles.

Figure 7:
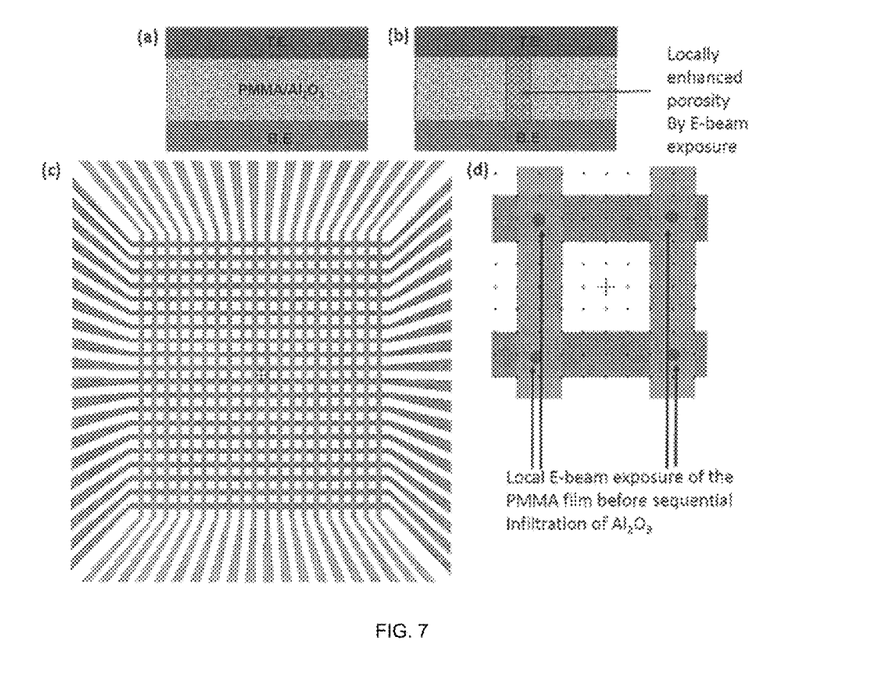
FIG. 7 shows resistive switching device structure with PMMA-$Al_2O_3$ nanocomposite in (a); modified device structure where PMMA is selectively exposed to E-beam irradiation before $Al_2O_3$ infiltration, resulting in enhanced porosity in the irradiated region in (b); crossbar architecture for high-density nanocomposite memory development in (c). This particular embodiment has 20×20 array of devices with each device having a footprint of 200×200 $nm^2$; a schematic of the layout showing the region of the polymer (indicated by the arrows) that will be irradiated with E-beam in (d).

The nanocomposite disclosed herein can be porous. In embodiments, the polymer comprises pores of a size from 0.1 nm to 5 nm such as 0.1 nm, 0.2 nm, 0.3 nm, 0.4 nm, 0.5 nm, 0.6 nm, 0.7 nm, 0.8 nm, 0.9 nm, 1 nm, 1.5 nm, 2 nm, 2.5 nm, 3 nm, 3.5 nm, 4 nm, 4.5 nm, or 5 nm. In embodiments, the polymer comprises pores of a size of about 1 nm. In embodiments, the porosity of the polymer can be controlled by exposure to electron beam or by baking the nanocomposite after SIS. In embodiments, the nanocomposite comprises locally enhanced porosity. The term "locally enhanced porosity" refers to one particular section of the nanocomposite that is more porous than the rest of the nanocomposite (for example, as shown in FIG. 7 in (b)). Without intending to be bound by theory, it is thought the locally enhanced porosity section of the nanocomposite will have higher porosity and thereby will allow higher diffusivity of metal ions, such as metal cations, in that particular section of the nanocomposite during operation of the resistive switching device. As a result, resistive switching device variability can be further reduced as operating voltages can be decreased even further. In embodiments, the polymer comprises less than 10% by volume locally enhanced porosity. In embodiments, the polymer comprises less than 25% by volume locally enhanced porosity. In embodiments, the polymer comprises less than 50% by volume locally enhanced porosity. In embodiments, the polymer comprises less than 75% by volume locally enhanced porosity.

The nanocomposite can undergo a baking step after the SIS. The baking step can comprise a temperature of 150° C. to 180° C. such as, 150° C., 155° C., 160° C., 165° C., 170° C., 175° C., or 180° C. In embodiments, the baking step can comprise a temperature of about 180° C. The baking step can occur for 1 to 10 minutes, such as, 1, 2, 3, 4, 5, 6, 7, 8, 9, or 10 minutes. In embodiments, the baking step can occur for about 3 minutes.

Figure 6:
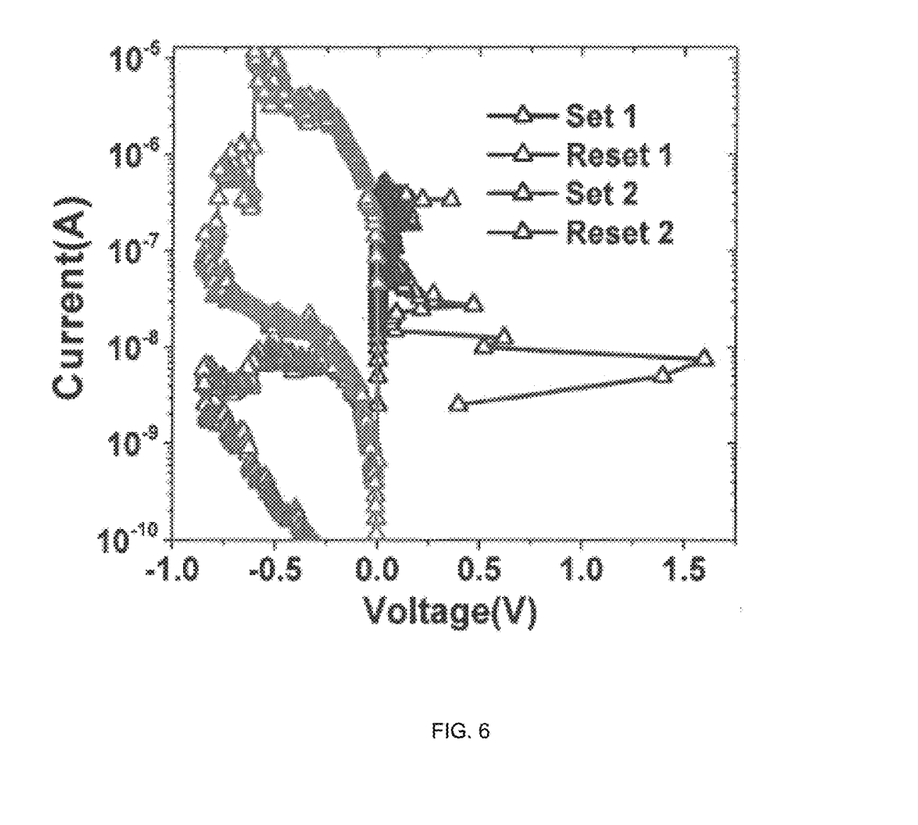
FIG. 6 Non-volatile resistive switching at ultra-low current in Ag/PMMA-$Al_2O_3$ (10 nm)/Pt devices after baking at 180° C., for 6 minutes.

In embodiments where the nanocomposite has undergone a baking step, the resistive switching device can demonstrate non-volatile switching at ultra-low currents, for example 500 nA (see, e.g., FIG. 6). Without intending to be bound by theory, the ability for the device to demonstrate non-volatile switching at such a low current is thought to be possible due to microstructural change of the nanocomposite after baking.

The nanocomposite layer of the devices disclosed herein can have a thickness of up to 100 nm, e.g., 10 nm to 100 nm. In embodiments, the nanocomposite layer can have a thickness of up to 50 nm, e.g., 10 nm to 50 nm. In embodiments, the nanocomposite can have a thickness of 10 nm, 15 nm, 20 nm, 25 nm, 30 nm, 35 nm, 40 nm, 45 nm or 50 nm.

Polymer

The polymer of the nanocomposite described herein can comprise any polymer or blend of polymers known to one skilled in the art. For example, the polymer can comprise poly(methyl methacrylate) ("PMMA"), polydimethyl siloxane, polyimide, bisphenol A novolac epoxy or a mixture thereof. In embodiments, the polymer comprises poly(methyl methacrylate). PMMA can include a PMMA homopolymer, a PMMA copolymer, a PMMA terpolymer or a mixture thereof. In embodiments, the polymer comprises a PMMA homopolymer.

When the PMMA is a copolymer or terpolymer, the other monomers to be copolymerized with are generally carboxyl group-containing ethylenically unsaturated monomers, e.g., methyl (meth)acrylate, ethyl (meth)acrylate, n-propyl (meth)acrylate, isopropyl (meth)acrylate, n-butyl (meth)acrylate, isobutyl (meth)acrylate, tert-butyl (meth)acrylate, 2-ethylhexyl acrylate, n-octyl (meth)acrylate, lauryl (meth)acrylate, tridecyl (meth)acrylate, octadecyl (meth)acrylate, isostearyl (meth)acrylate, $C_{1-24}$-alkyl (meth)acrylate and the like; 2-hydroxyethyl (meth)acrylate, hydroxypropyl (meth)acrylate, the polyhydric; DOO, 2,3-dihydroxy-butyl (meth)acrylate, 4-hydroxybutyl (meth)acrylates such as, polyethylene glycol mono(meth)acrylate, polyhydric monoesters of alcohols with acrylic acid or methacrylic acid hydroxyl group-containing monomers such as ε-caprolactone monoester of alcohol and acrylic acid or methacrylic acid and ring-opening polymerization; styrene, acrylonitrile, methacrylonitrile, and vinyl acetate. These monomers can be used alone or can be used in combination of two or more different monomers.

The PMMA weight average molecular weight ("Mw") can be tuned based on the application needs. In embodiments, the PMMA Mw is 300,000 or less. In embodiments, the PMMA Mw can be 100,000 or less. In some embodiments, the PMMA Mw can be between 100,000 to 250,000. When a polymer is described as having (or not having) a particular Mw, unless specified otherwise, it is intended that the specified molecular weight is the weight average molecular weight for the resin, which inherently can have a molecular weight distribution.

The polymer of the nanocomposite described herein can undergo a baking step prior to the SIS. In embodiments, the baking step can comprise a temperature of 150° C. to 180° C. such as, 150° C., 155° C., 160° C., 165° C., 170° C., 175° C., or 180° C. In embodiments, the baking step can comprise a temperature of 180° C.

Metal Oxide

The resistive switching devices herein comprise a nanocomposite comprising a metal oxide infiltrated throughout the polymer. In embodiments, the metal oxide can be aluminum oxide ($Al_2O_3$), titanium oxide ($TiO_2$), hafnium oxide ($HfO_2$), zinc oxide (ZnO) or a mixture thereof. In various embodiments, the metal oxide comprises $Al_2O_3$. In embodiments, the metal oxide can comprise cerium, lanthanum, yttrium, erbium, terbium, ytterbium, scandium, praseodymium, gadolinium, samarium, or a mixture thereof.

Electrodes

The resistive switching device described herein can comprise two electrodes. In some embodiments, the resistive switching device can comprise an inert electrode and an active electrode.

Inert Electrode

The inert electrode can comprise any metal known to one skilled in the art. As used herein, the term "inert electrode" refers to an electrode composed of one or more metals that serves as a source of electrons but may not participate in a chemical reaction. In embodiments, the inert electrode can comprise more than one metal. In embodiments, the inert electrode comprises platinum, palladium, titanium, gold, or a mixture thereof. In embodiments, the inert electrode comprises platinum, titanium or combinations thereof. In embodiments, the inert electrode comprises platinum and titanium.

In embodiments, the inert electrode can have a thickness of 100 nm or less, for example, 30 nm to 100 nm, 30 nm to 80 nm, or 30 nm to 70 nm. In embodiments, the inert electrode can have a thickness of 30 nm to 70 nm, or 50 to 80 nm. Contemplated thickness of the inert electrode include, for example, 30 nm, 35 nm, 40 nm, 45 nm, 50 nm, 55 nm, 60 nm, 65 nm, 70 nm, 75 nm, or 80 nm.

In some cases, the inert electrode comprises titanium and platinum. In such embodiments, the platinum can have a thickness of 30 nm to 100 nm, such as 30 nm, 40 nm, 50 nm, 60 nm, 70 nm, 80 nm, 90 nm, or 100 nm. In some embodiments, the platinum can have a thickness of 40 nm to 50 nm. In some embodiments, the titanium can have a thickness of 1 nm to 15 nm, such as 1 nm, 2 nm, 3 nm, 4 nm, 5 nm, 6 nm, 7 nm, 8 nm, 9 nm, 10 nm, or 15 nm. In some embodiments, the titanium can have a thickness of 5 nm. In some cases, the platinum has a thickness of 40 to 50 nm (e.g., 50 nm) and the titanium has a thickness of 1 to 10 nm (e.g., 5 nm).

Active Electrode

As used herein, the term "active electrode" refers to an electrode composed of one or more metals that may participate in a chemical reaction either by oxidation or reduction. In embodiments, the active electrode can comprise more than one metal. In embodiments, the active electrode comprises gold or platinum and either silver or copper. In embodiments, the active electrode comprises a film. In embodiments, the active electrode comprises a metallic film and another metal. In embodiments, the active electrode comprises a film of silver or copper and a gold layer. In embodiments, the active electrode comprises a film of silver or copper and a gold layer on top of the film. In embodiments, the active electrode can comprise a chemically reactive metal. In embodiments, the chemically reactive metal can be Ag, Cu, or a mixture thereof.

In embodiments, the active electrode comprises more than one metal and the metals are each at least 5 nm thick. In embodiments, the active electrode comprises more than one metal and each metal has a thickness of 100 nm or less. In embodiments, the active electrode comprises more than one metal wherein one metal has a thickness of 1 nm to 50 nm (e.g., 5 to 20 nm) and a second metal has a thickness of 30 nm to 150 nm (e.g., 50 to 100 nm). In embodiments, the active electrode comprises a film of silver or copper wherein the film can have a thickness of 5 to 20 nm and a gold layer wherein the gold layer can have a thickness of 30 to 100 nm. In embodiments, the active electrode comprises more than one metal, wherein a first metal comprises a chemically reactive metal and a second metal comprises an inert metal. In embodiments, the chemically reactive metal comprises silver or copper and the inert metal comprises gold or platinum. The inert metal of the active electrode can prevent the chemically reactive metal from oxidation.

In embodiments, the active electrode, inert electrode, or a mixture thereof can have an area (length×width, not thickness) of 100 nm$^2$ to 50,000 µm$^2$. In embodiments, the active electrode can have an area of 100 µm$^2$ to 20,000 µm$^2$. In embodiments, the active electrode can have an area of 1,000 µm$^2$ to 20,000 µm$^2$, such as 1,000 µm$^2$, 5,000 µm$^2$, 10,000 µm$^2$, 15,000 µm$^2$, or 20,000 µm$^2$. In embodiments, the active electrode can have an area of 10,000 µm$^2$. In embodiments, the inert electrode can have an area of 100 µm$^2$ to 20,000 µm$^2$. In embodiments, the inert electrode can have an area of 1,000 µm$^2$ to 20,000 µm$^2$, such as 1,000 µm$^2$, 5,000 µm$^2$, 10,000 µm$^2$, 15,000 µm$^2$, or 20,000 µm$^2$. In embodiments, the inert electrode can have an area of 10,000 µm$^2$.

Method of Preparing the Resistive Switching Device

The methods herein provide a disclosure for the preparation of the resistive switching devices herein. In embodiments, a resistive switching device as disclosed herein can be prepared by a method comprising (a) depositing the polymer on the first electrode by spin-coating to form a polymer layer, baking the polymer layer at a temperature of 180° C. and optionally irradiating a portion of the polymer layer with an electron beam to form a higher porosity polymer; (b) infiltrating the polymer layer with a metal oxide using sequential infiltration synthesis via atomic layer deposition to form the nanocomposite and optionally baking the nanocomposite after SIS at a temperature of 180° C.; and (c) depositing the second electrode on the nanocomposite by photo/electron-beam lithography followed by electron beam evaporation of the second electrode metal or metals. In some embodiments, the resistive switching device can be prepared by comprising steps (a)-(c) and additionally baking the nanocomposite, irradiating a portion of the polymer layer with an electron beam to form a locally enhanced porous section of the polymer layer, or a combination thereof. In embodiments, previous to step (a), the first electrode can be deposited onto a silicon substrate disclosed herein by electron beam evaporation. In some embodiments, the methods (a)-(c) comprise the additional baking of the polymer layer of the nanocomposite after the SIS and the temperature at which the polymer layer is baked can be 180° C. In embodiments, the baking of the polymer layer of the nanocomposite after the SIS can be performed in multiple steps, for example, baking the nanocomposite film at 180° C. for 6 min can be performed in two separate baking steps with each step lasting for 3 minutes. A particular embodiment of a method of preparing the resistive switching device can be seen in FIG. 1.

EXAMPLES

Example 1—Synthesis of a Resistive Switching Device

Figure 1:
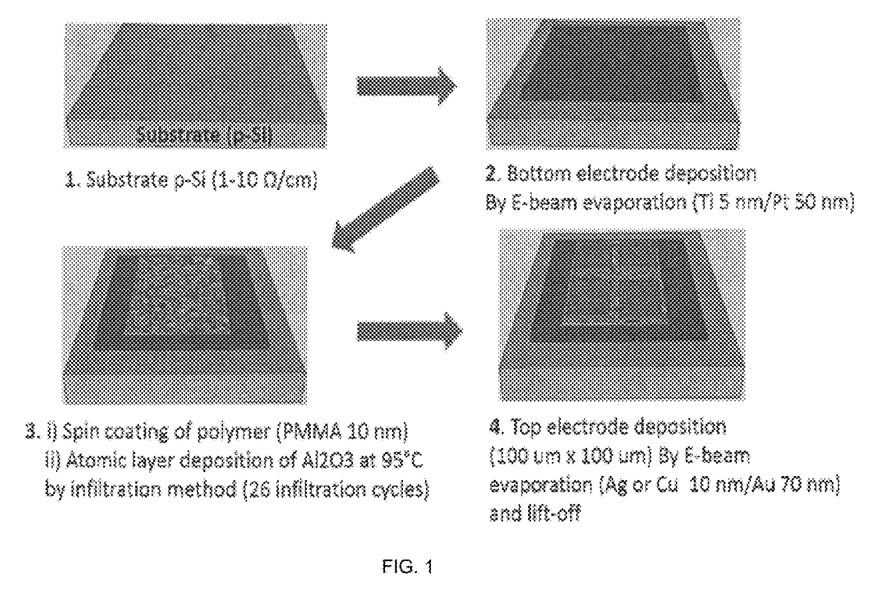
FIG. 1 is a depiction of the fabrication process details of a resistive switching device disclosed herein.
Figure 2:
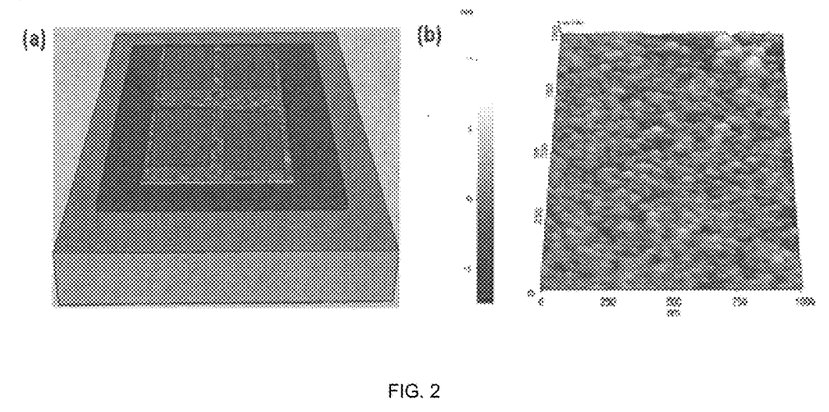
FIG. 2 shows a 3D schematic of a sample with PMMA-$Al_2O_3$ nanocomposite switching layer, an inert electrode and an active electrode on a p-type silicon substrate layer in (a) and shows an Atomic force microscope image of the PMMA-$Al_2O_3$ nanocomposite showing a homogenous film in (b).
Figure 9:
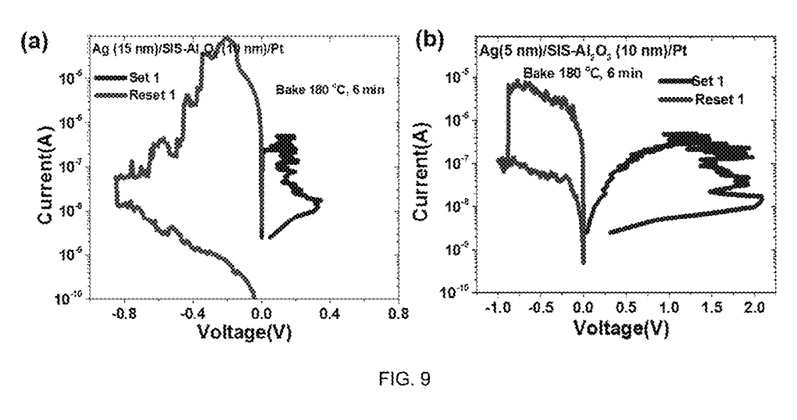
FIG. 9 shows switching characteristics of resistive switching devices with two different active electrode thicknesses (Ag). The switching voltages of a 15 nm Ag electrode in (a) are less compared to that of a 5 nm Ag electrode in (b).

The method of preparing a resistive switching device is illustrated in FIG. 1. The devices in this embodiment were fabricated on a Silicon substrate (p-type doped with resistivity between 1-10 Ω/cm). The inert electrode consisted of a bi-layer stack of thin films of Ti (5 nm)/Pt (50 nm). A polymer layer (10 nm) was deposited on top by spin-coating. The polymer used was Poly(methyl methacrylate). After baking the polymer film at 180° C., the polymer film was infiltrated with Al$_2$O$_3$ using atomic layer deposition. The particular method used was sequential infiltration synthesis. Next, the active electrodes were defined by photolithography followed by electron beam evaporation of Ag or Cu (10 nm) followed by Au (70 nm). In other embodiments of the device the thickness of the Ag or Cu thin film can be changed to alter the switching characteristics. Without intending to be bound by theory, by increasing the thickness of the chemically active metal, such as Ag or Cu, the switching voltage can be reduced. Further, if the thickness of the active electrode is reduced, the switching voltages increase. For example, FIG. 9 compares switching characteristics of two different active electrode thicknesses (Ag). The switching voltages with 15 nm Ag (FIG. 9 in (a)) are less compared to that of 5 nm Ag electrode (FIG. 9 in (b)). The device in FIG. 9 in (a) also has reduced switching voltages compared to devices with 10 nm Ag electrode (FIG. 6). Resistive switching device area is defined by the size of the active electrodes which can vary from 50 µm to 200 µm in this particular embodiment. An atomic force microscopy image of the nanocomposite can be seen in FIG. 2 in (b).

Example 2—Operating Resistive Switching Devices

Figure 3:
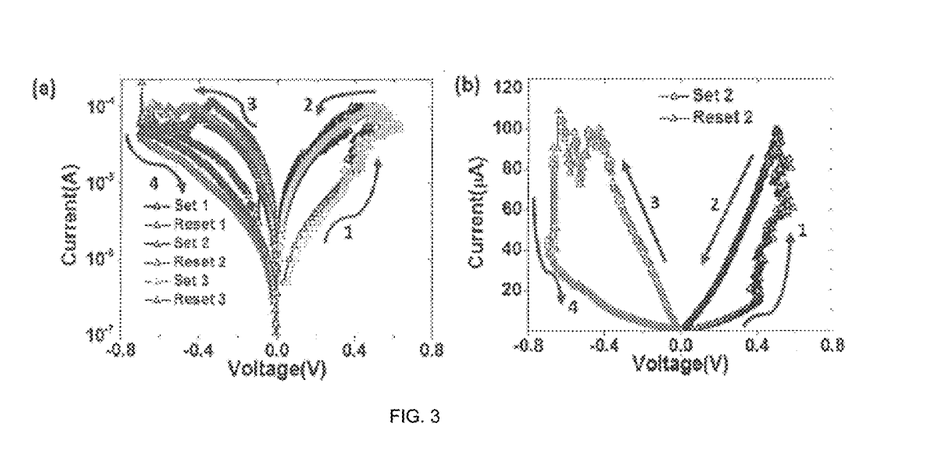
FIG. 3 shows the switching characteristics of the device with 100 $\mu$A operating current in (a). At this current, the device shows bipolar resistive memory behavior. Under a positive voltage sweep the device first turns on from an off state at $V_{ON}$~500 mV (path 1) and stays on as the voltage is then reduced from $V_{ON}$ to zero (path 2). The device can be turned off by applying a negative voltage sweep (path 3 and 4). The switching characteristics of the device on a linear scale are shown in (b).

In embodiments, a memory window of an order of magnitude was observed (FIG. 3 in (a)) with a resistive switching device disclosed herein. However this window was further increased by increasing the operating current. The voltage required in the first cycle (Set 1) to turn the device on was the same as the turn-on voltage for the subsequent cycles (Set 2 and 3). This was in contrast with most resistive switching devices which require a significantly higher voltage in the first cycle (also called Forming process) compared to the regular on/off voltages. The data in FIG. 3 in (a) indicates that the device is a "Forming-free" resistive switching device.

Notably in FIG. 3 in (b), the turn-on process for the resistive switching device under the positive sweep (path 1) was not abrupt. The continuous turn-on procedure made the resistive switching device an attractive candidate for neuromorphic applications. Also notable is the maximum reset current when the device turns off was the same as the operating current for the turn-on (Set) process. This indicated that the switching is filamentary, i.e. the set/reset processes were controlled by creation/rupture of a conductive bridge path through the dielectric. Since the active electrode in this embodiment of the resistive switching device is Ag, the filament was created under positive voltage sweep by diffusion of Ag ions into the PMMA-$Al_2O_3$ nanocomposite.

Figure 4:
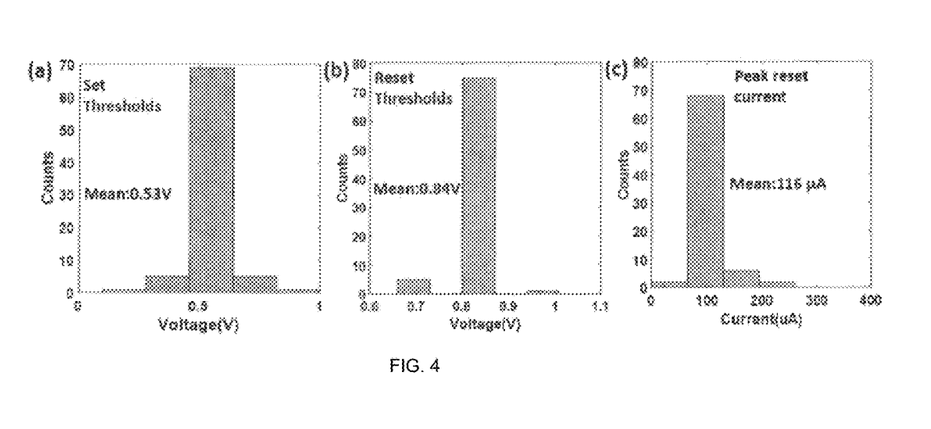
FIG. 4 shows cycle-to-cycle statistics of (a) Set voltage, (b) Reset voltage and (c) peak reset current of devices disclosed herein. Statistics is taken over 80 Set and Reset cycles.
Figure 5:
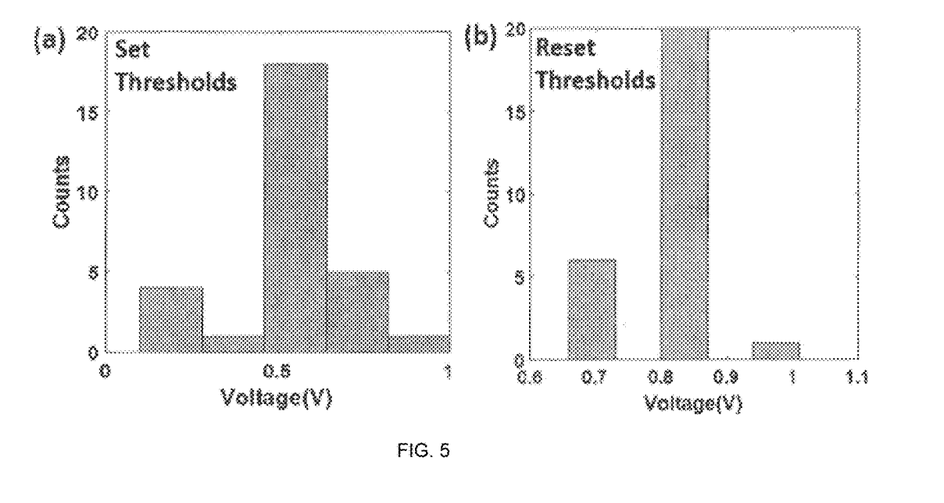
FIG. 5 exhibits the device-to-device statistics of the set/reset voltages for the fabricated resistive switching devices measured over 20 different devices disclosed herein.

The cycle-to-cycle switching statistics of the resistive switching device was demonstrated in FIG. 4. The distribution of the set and reset voltages measured over 80 consecutive cycles show excellent uniformity. The average set and reset voltages are 0.53 V and 0.84 V respectively. The standard deviations for the set and reset voltages were found to be 0.08 V and 0.04 V respectively. The distribution of peak reset current also showed that the peak reset current closely corresponded to the set current (100 RA). This also proves that the resistive switching devices herein do not exhibit significant current overshoot during the reset process. Excellent distribution is observed for device-to-device statistics as well (FIG. 5).

The resistive switching devices after the additional baking step of the nanocomposite demonstrated switching at ultra-low current of 500 nA (FIG. 6). Even at the ultra-low current of operation a memory window of an order of magnitude is observed. The ability for the device to demonstrate non-volatile switching at such a low current possibly occurred due to microstructural change of the polymer nanocomposite after baking.

In embodiments, the resistive switching devices herein, wherein the polymer film will be selectively irradiated within a nanoscale region (~10 nm) using electron beam (FIG. 7). As a result after the infiltration with $Al_2O_3$ the irradiated zone of 10 nm within the film had higher porosity compared to the rest of the nanocomposite film. As a result, resistive switching device variability can be further reduced as operating voltages can be decreased even further. FIG. 7 in (c) shows the 20×20 crossbar architecture for implementation of the memory arrays with the polymer-oxide nanocomposite resistive switching devices.

Example 3—Comparative Example

Figure 8:
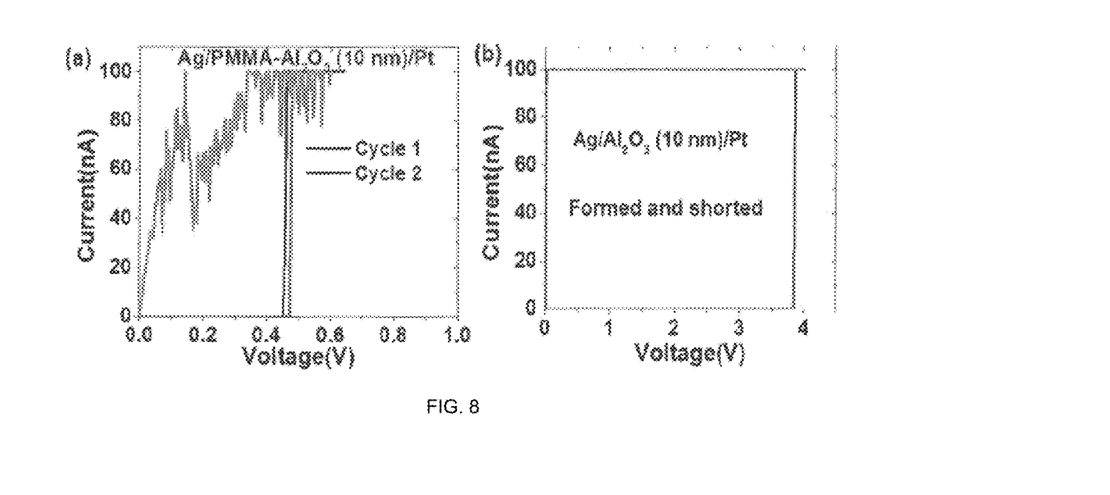
FIG. 8 shows the switching characteristics of the Ag/PMMA-Al$_2$O$_3$ (10 nm)/Pt devices disclosed herein at ultra-low operating current (100 nA) in (a); Switching in Ag/Al$_2$O$_3$ (10 nm)/Pt devices showing high switching voltage (4 V) and unstable switching (device shorts after switching) in (b).

The switching characteristics of a Ag/PMMA-$Al_2O_3$ (10 nm)/Pt devices at 100 nA operating current were shown in FIG. 8 in (a). At this current level the resistive switching device acted as a selector switch, i.e., it turns on at a positive threshold voltage but turns off after removal of the applied bias. This was seen from the two subsequent cycles of operation (cycle 1 and 2 respectively). After the completion of the first cycle the resistive switching device turns off when the bias was removed. As a result the resistive switching device in cycle 2 was initially turned off and turns on at ~450 mV but turns off again after the removal of bias. Note that the switching voltage in the resistive switching device was ~450 mV which is almost an order of magnitude lower than a control, which consisted of a different device with a pure $Al_2O_3$ switching layer of same thickness (10 nm). The device with pure $Al_2O_3$ (10 nm) as the switching layer (deposited also by atomic layer deposition) switched at ~4 V and shows unstable switching (i.e., shows tendency to form a permanent short after switching). Therefore the disclosed resistive switching devices herein provide a significant advantage over conventional metal oxide based devices in terms of the operating voltage.

The foregoing description is given for clearness of understanding only, and no unnecessary limitations should be understood therefrom, as modifications within the scope of the disclosure herein may be apparent to those having ordinary skill in the art.

Throughout this specification and the claims which follow, unless the context requires otherwise, the word "comprise" and variations such as "comprises" and "comprising" will be understood to imply the inclusion of a stated integer or step or group of integers or steps but not the exclusion of any other integer or step or group of integers or steps.

What is claimed:
1. A resistive switching device comprising
   a nanocomposite comprising a polymer with a metal oxide infiltrated throughout the polymer;
   an inert electrode and;
   an active electrode, wherein the inert electrode and the active electrode are separated by the nanocomposite, and the active electrode has an area of 1,000 µm$^2$ to 20,000 µm$^2$.
2. The resistive switching device of claim 1, wherein the polymer comprises poly(methyl methacrylate), polydimethyl siloxane, polyimide, bisphenol A novolac epoxy, or a mixture thereof.
3. The resistive switching device of claim 2, wherein the polymer comprises poly(methyl methacrylate).
4. The resistive switching device of claim 1, wherein the metal oxide comprises aluminum oxide ($Al_2O_3$), titanium oxide ($TiO_2$), hafnium oxide ($HfO_2$), zinc oxide (ZnO), or a mixture thereof.
5. The resistive switching device of claim 4, wherein the metal oxide comprises $Al_2O_3$.
6. The resistive switching device of claim 1, wherein the nanocomposite has a thickness of 10 nm to 50 nm.

7. The resistive switching device of claim 6, wherein the nanocomposite has a thickness of 10 nm.

8. The resistive switching device of claim 1, wherein the nanocomposite comprises a porous section.

9. The resistive switching device of claim 8, wherein the porous section of the nanocomposite comprises pore sizes of about 1 nm.

10. The resistive switching device of claim 1, wherein the inert electrode comprises platinum, palladium, titanium, gold, or a mixture thereof.

11. The resistive switching device of claim 10, wherein the inert electrode comprises platinum, titanium, or a combination of.

12. The resistive switching device of claim 1, wherein the inert electrode has a thickness of 30 to 70 nm.

13. The resistive switching device of claim 1, wherein the active electrode comprises gold or platinum and either silver or copper.

14. The resistive switching device of claim 13, wherein the active electrode comprises a film of silver or copper with a gold layer on top.

15. The resistive switching device of claim 14, wherein the film of silver or copper has a thickness of 5 to 20 nm and the gold layer has a thickness of 50 nm to 100 nm.

16. The resistive switching device of claim 1, further comprising a silicon substrate under the inert electrode, optionally where the silicon substrate comprises a p-type dopant with resistivity of 1 to 10 Ω/cm.

17. The resistive switching device of claim 1 having a switching current of 500 nA to 100 μA, or an operating voltage of about 400 mV.

18. A method of preparing the resistive switching device of claim 1 comprising (a) depositing the polymer on the first electrode by spin-coating to form a polymer layer, baking the polymer layer at a temperature of 180° C., and optionally irradiating a portion of the polymer layer with an electron beam to form a higher porosity polymer;

(b) infiltrating the polymer layer with a metal oxide using sequential infiltration synthesis via atomic layer deposition to form the nanocomposite; and (c) depositing the second electrode on the nanocomposite by photolithography followed by electron beam evaporation of the second electrode metal or metals.

19. The method of claim 18, wherein the second electrode is prepared by electron beam evaporation of silver or copper to a thickness of 10 nm then electron beam evaporation of gold to a thickness of 70 nm.

20. A resistive switching device comprising
a nanocomposite comprising a polymer with a metal oxide infiltrated throughout the polymer, and the nanocomposite having a porous section with pore sizes of about 1 nm;
an inert electrode and;
an active electrode,
wherein the inert electrode and the active electrode are separated by the nanocomposite.

21. A resistive switching device comprising
a nanocomposite comprising a polymer with a metal oxide infiltrated throughout the polymer;
an inert electrode and;
an active electrode comprising gold or platinum and either silver or copper,
wherein the inert electrode and the active electrode are separated by the nanocomposite.

* * * * *

UNITED STATES PATENT AND TRADEMARK OFFICE
CERTIFICATE OF CORRECTION

| | | |
|---|---|---|
| PATENT NO. | : 10,483,464 B1 | Page 1 of 1 |
| APPLICATION NO. | : 15/994589 | |
| DATED | : November 19, 2019 | |
| INVENTOR(S) | : Bhaswar Chakrabarti et al. | |

It is certified that error appears in the above-identified patent and that said Letters Patent is hereby corrected as shown below:

In the Claims

At Column 11, Line 13, Claim 11: "of." should be -- thereof. --.

Signed and Sealed this
First Day of September, 2020

Andrei Iancu
*Director of the United States Patent and Trademark Office*